(12) United States Patent
Ueta et al.

(10) Patent No.: US 12,438,478 B2
(45) Date of Patent: Oct. 7, 2025

(54) HERMETICALLY SEALED PIEZOELECTRIC DEVICE WITH INTEGRATED TEMPERATURE SENSOR AND OPTIMIZED THERMAL CHARACTERISTICS

(71) Applicant: KYOCERA Corporation, Kyoto (JP)

(72) Inventors: Takahiro Ueta, Kyoto (JP); Motoharu Ando, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 228 days.

(21) Appl. No.: 18/158,578

(22) Filed: Jan. 24, 2023

(65) Prior Publication Data

US 2023/0163702 A1    May 25, 2023

Related U.S. Application Data

(63) Continuation of application No. PCT/JP2021/027163, filed on Jul. 20, 2021.

(30) Foreign Application Priority Data

Jul. 29, 2020   (JP) ................................ 2020-128278

(51) Int. Cl.
   *H02N 2/00*   (2006.01)
(52) U.S. Cl.
   CPC ............. *H02N 2/008* (2013.01); *H02N 2/005* (2013.01); *H02N 2/009* (2013.01)

(58) Field of Classification Search
   CPC ........ H02N 2/008; H02N 2/005; H02N 2/009; H10N 30/88; H03B 5/32; H03H 9/02; H03H 9/10
   See application file for complete search history.

(56) References Cited

U.S. PATENT DOCUMENTS

| | | | |
|---|---|---|---|
| 9,548,717 B2 * | 1/2017 | Takase | ...................... H03H 9/08 |
| 10,749,467 B2 * | 8/2020 | Noto | .......................... H03L 1/04 |
| 2019/0312565 A1 | 10/2019 | Kojo | |

FOREIGN PATENT DOCUMENTS

| | | |
|---|---|---|
| JP | 2014-187641 A | 10/2014 |
| JP | 2019-114998 A | 7/2019 |
| JP | 2020-161908 A | 10/2020 |
| WO | 2018/092572 A1 | 5/2018 |

* cited by examiner

*Primary Examiner* — Emily P Pham
(74) *Attorney, Agent, or Firm* — Volpe Koenig

(57) ABSTRACT

A piezoelectric device includes a piezoelectric element, a mounting plate, an electronic element including a temperature sensor therein, a base on which the piezoelectric element is mounted with the mounting plate therebetween and on which the electronic element is mounted, and a lid joined to the base and hermetically sealing at least the piezoelectric element and the mounting plate.

17 Claims, 12 Drawing Sheets

FIG. 2
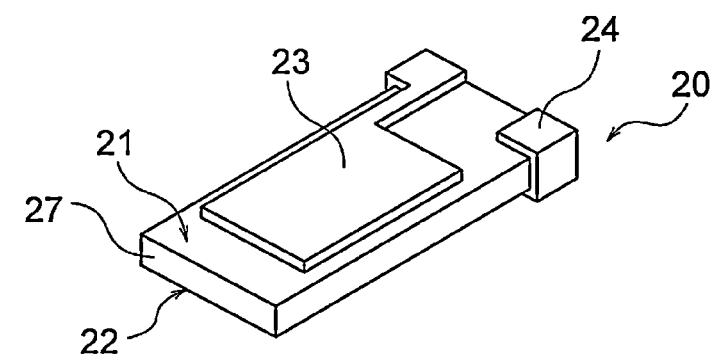
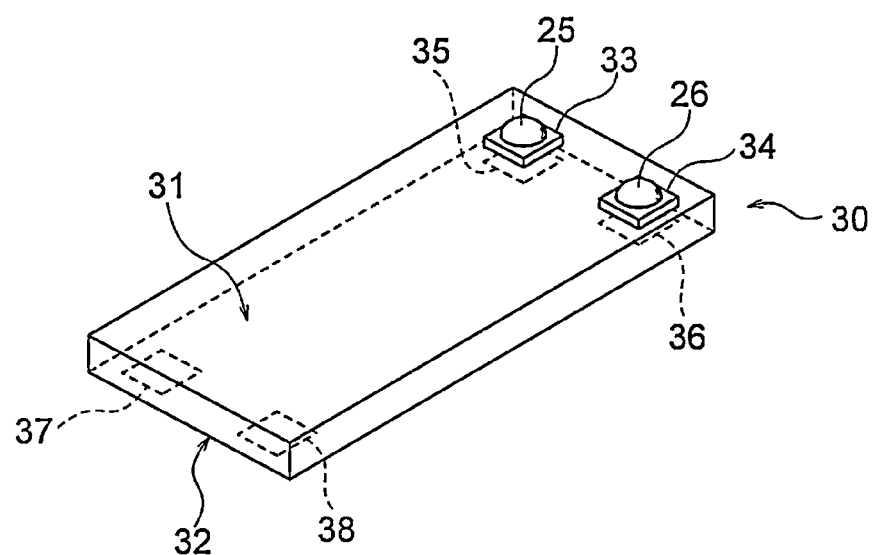

PRIOR ART

HERMETICALLY SEALED PIEZOELECTRIC DEVICE WITH INTEGRATED TEMPERATURE SENSOR AND OPTIMIZED THERMAL CHARACTERISTICS

TECHNICAL FIELD

The present disclosure relates to a piezoelectric device including a piezoelectric element and an electronic element.

TECHNICAL BACKGROUND

A piezoelectric device including a piezoelectric element and an electronic element is in widespread use. The piezoelectric element has a frequency-temperature characteristic in which its oscillation frequency varies with changes in temperature. The electronic element includes a temperature sensor therein, and controls operation of the piezoelectric element based on temperature information obtained through the temperature sensor so that the oscillation frequency is constant regardless of a change in temperature. Examples of such known piezoelectric devices include a temperature compensated crystal oscillator (hereinafter, referred to as a TCXO) (refer to, for example, Japanese Unexamined Patent Application Publication No. 2014-187641). The TCXO includes a crystal vibrator element, serving as a piezoelectric element, and an integrated circuit (IC), serving as an electronic element.

SUMMARY

The present disclosure provides a piezoelectric device including a piezoelectric element, a mounting plate, an electronic element including a temperature sensor therein, a base on which the piezoelectric element is mounted with the mounting plate therebetween and on which the electronic element is mounted, and a lid joined to the base and hermetically sealing at least the piezoelectric element and the mounting plate.

BRIEF DESCRIPTION OF THE DRAWINGS

FIG. 2 is an exploded perspective view illustrating a piezoelectric element and a mounting plate in the piezoelectric device according to Embodiment 1.

DETAILED DESCRIPTION

Figure 11:
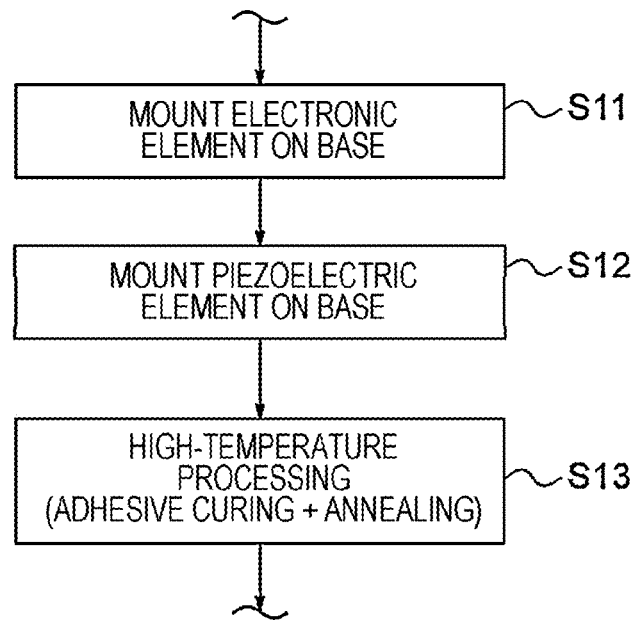
FIG. 11 is a flowchart illustrating a first example of a method for making a typical piezoelectric device.
Figure 12:
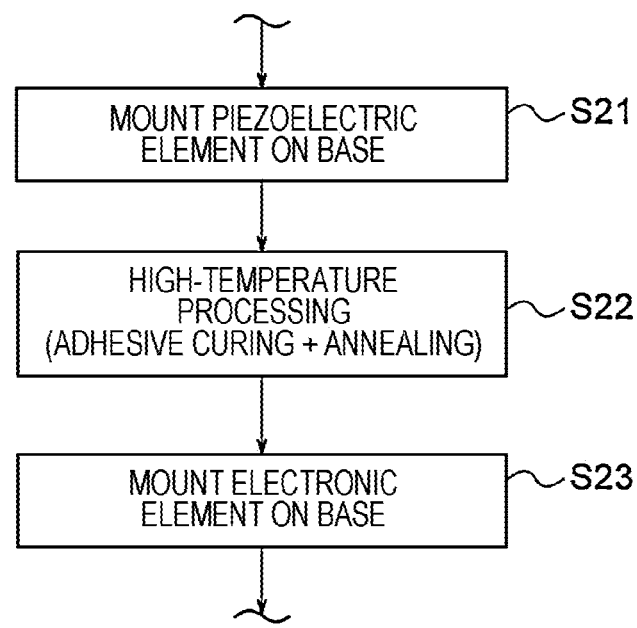
FIG. 12 is a flowchart illustrating a second example of a method for making a typical piezoelectric device.

A typical piezoelectric device includes a base and a lid, which define a hermetically enclosed space. The hermetically enclosed space contains a piezoelectric element and an electronic element that are mounted on the base. Mounting the piezoelectric element on the base requires high-temperature processing for, for example, curing a conductive adhesive and annealing for stabilization of properties. As illustrated in FIG. 11, if the electronic element is mounted on the base (S11) before the piezoelectric element is mounted on the base (S12, S13), the electronic element may be affected in its electrical characteristics by the high-temperature processing, which is unnecessary for the electronic element, performed on the electronic element in mounting the piezoelectric element. In contrast, as illustrated in FIG. 12, if the piezoelectric element is mounted on the base (S21, S22) before the electronic element is mounted on the base (S23), the piezoelectric element may be affected in its electrical characteristics by, for example, dust deposited on the piezoelectric element in mounting the electronic element. In other words, the electrical characteristics of the piezoelectric device may be impaired due to the order in which the piezoelectric element and the electronic element are mounted on the base.

A temperature change of an area surrounding the piezoelectric device propagates through the base and the like to the piezoelectric element and the electronic element. The electronic element detects a changing temperature at regular time intervals, and controls operation of the piezoelectric element in accordance with information on the detected temperature. However, the temperature of the piezoelectric element does not necessarily match the temperature of the electronic element. This may impair the frequency stability of the piezoelectric device.

First, the present disclosure aims to provide a piezoelectric device having improved electrical characteristics that can be attained by solving an issue arising from the order in which a piezoelectric element and an electronic element are mounted on a base. Second, the present disclosure aims to provide a piezoelectric device having improved frequency stability that can be attained by solving an issue arising from the difference in temperature between a piezoelectric element and an electronic element.

The present disclosure provides a piezoelectric device including a piezoelectric element mounted on a base with a mounting plate therebetween. Such a configuration allows only the piezoelectric element and the mounting plate to undergo high-temperature processing in mounting the piezoelectric element. This reduces or eliminates the likelihood that an electronic element may be affected in its electrical characteristics by the high-temperature processing, which is unnecessary for the electronic element, performed on the electronic element in mounting the piezoelectric element. If the mounting plate with the piezoelectric element is mounted after the electronic element is mounted, the electronic element will not undergo the high-temperature processing, which is unnecessary for the electronic element. Accordingly, the mounting plate with the piezoelectric element is mounted after the electronic element is mounted. This eliminates the likelihood of, for example, deposition of dust on the piezoelectric element in mounting the electronic element. Thus, the issue arising from the order in which the piezoelectric element and the electronic element are mounted on the base can be solved, leading to improved electrical characteristics of the piezoelectric device.

The piezoelectric device according to the present disclosure includes the piezoelectric element mounted on the base with the mounting plate therebetween. This configuration allows transfer of the ambient temperature of the piezoelectric device to the piezoelectric element to be delayed by an amount corresponding to the mounting plate. This can reduce the difference in temperature between the piezoelectric element and the electronic element if the temperature of the piezoelectric element changes earlier than the temperature of the electronic element. Thus, the issue arising from the temperature difference between the piezoelectric element and the electronic element can be solved, leading to improved frequency stability of the piezoelectric device.

Modes (hereinafter, referred to as "embodiments") for embodying the present disclosure will be described below with reference to the accompanying drawings. In the specification and the drawings, the same reference signs are used for substantially the same components to avoid redundant description. The shapes of components illustrated in the drawings are not necessarily drawn to scale for clarity and ease of illustration.

Embodiment 1

Figure 1:
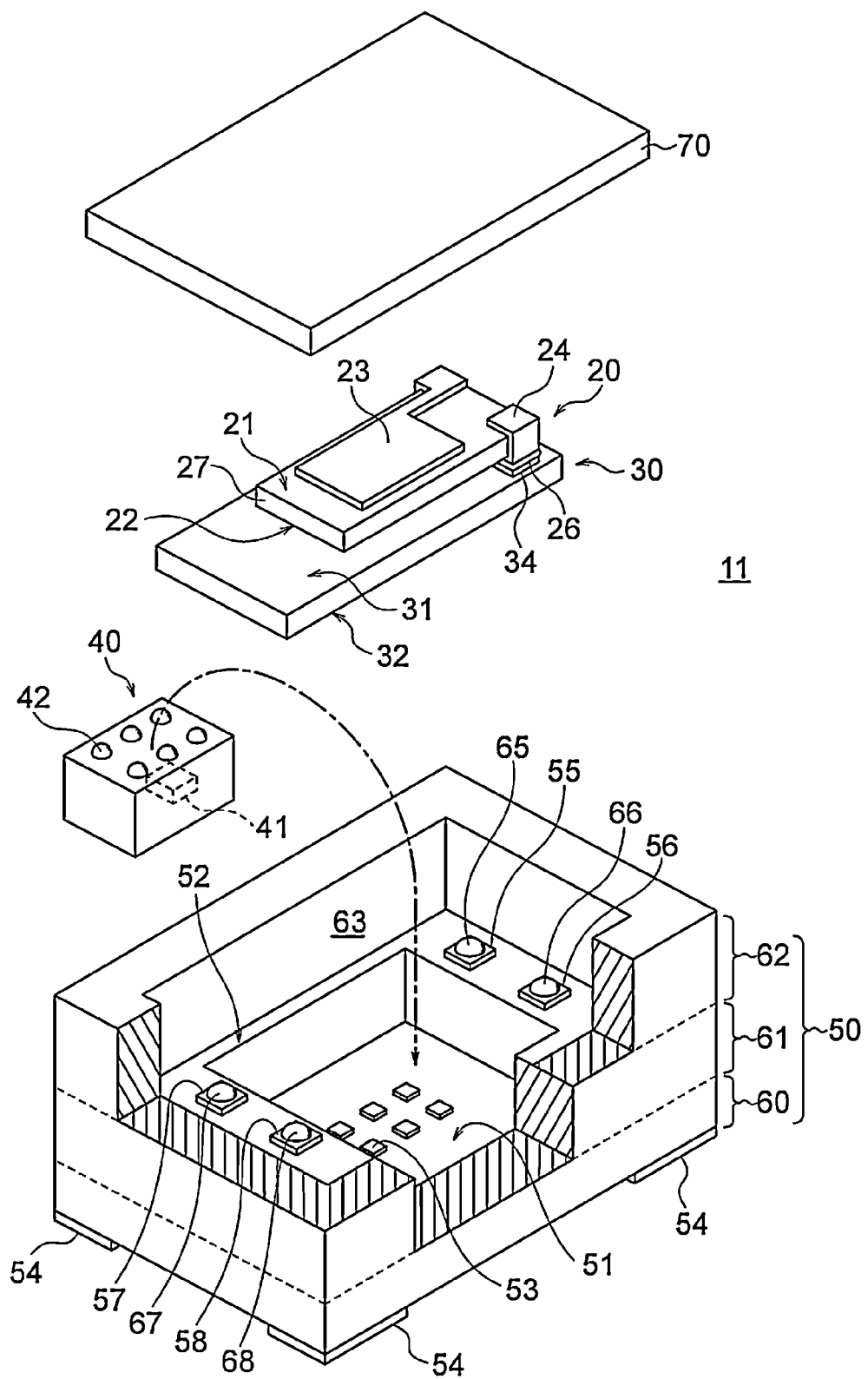
FIG. 1 is an exploded perspective view of a piezoelectric device according to Embodiment 1.
Figure 3:
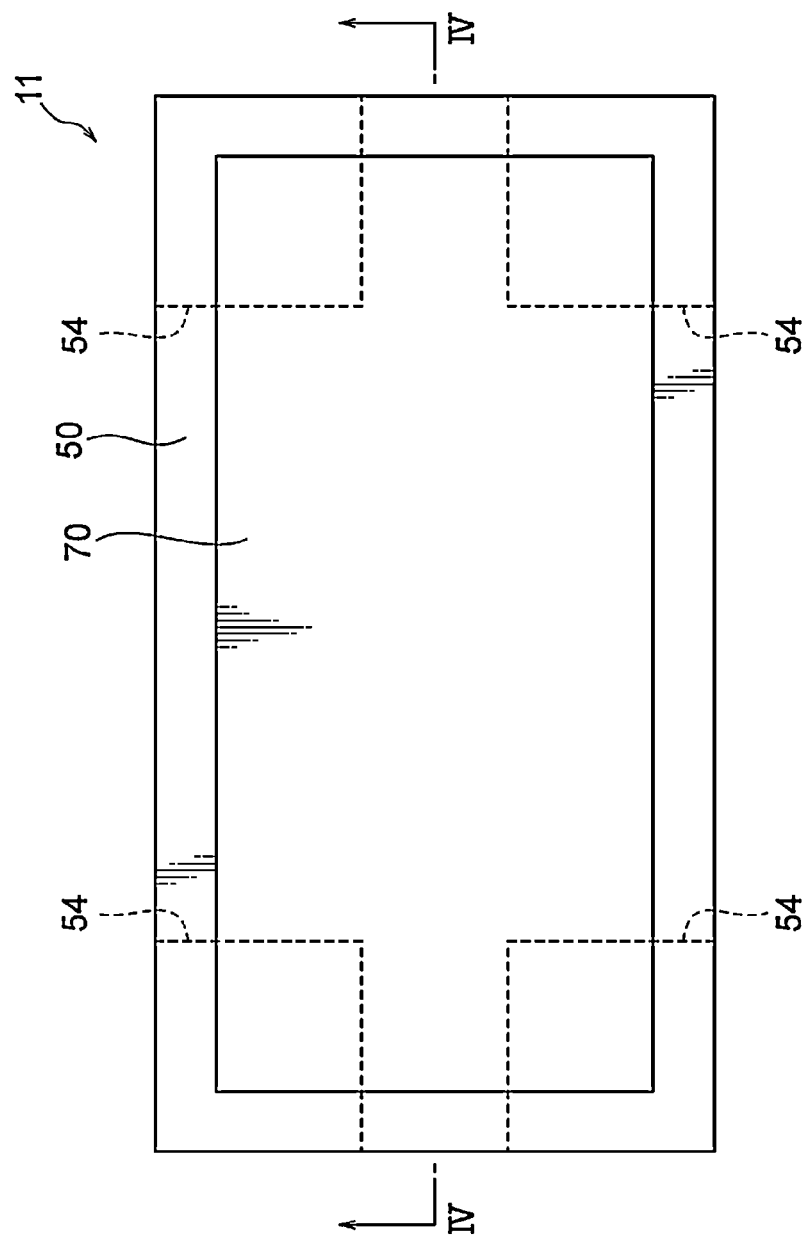
FIG. 3 is a plan view of the piezoelectric device according to Embodiment 1.
Figure 4:
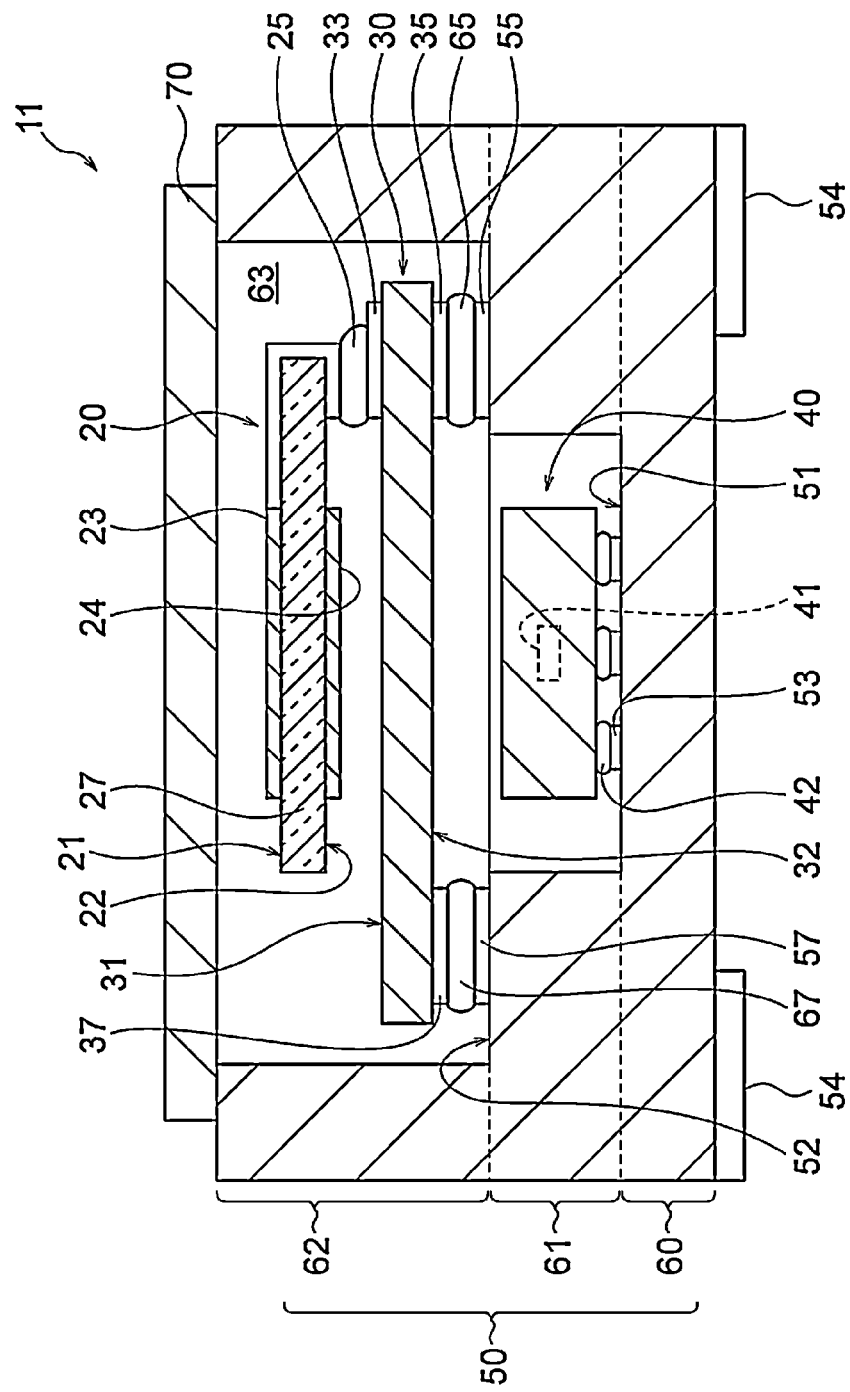
FIG. 4 is a sectional view taken along line IV-IV in FIG. 3.

A schematic configuration of a piezoelectric device 11 according to Embodiment 1 will be described with reference to FIGS. 1 to 4. In FIG. 1, a base 50 is illustrated with a portion cut away.

The piezoelectric device 11 includes a piezoelectric element 20, a mounting plate 30, an electronic element 40 including a temperature sensor 41 therein, the base 50 on which the piezoelectric element 20 is mounted with the mounting plate 30 therebetween and on which the electronic element 40 is mounted, and a lid 70 joined to the base 50 and hermetically sealing at least the piezoelectric element 20 and the mounting plate 30.

Embodiment 1 provides the following configuration. The base 50 includes a substrate 60, a first frame 61, and a second frame 62. The substrate 60 includes a first bottom surface 51, on which the electronic element 40 is mounted. The first frame 61 is located on an outer peripheral edge of the first bottom surface 51 and includes a second bottom surface 52, on which the piezoelectric element 20 is mounted with the mounting plate 30 therebetween. The second frame 62 is located on an outer peripheral edge of the second bottom surface 52. The lid 70 is joined to the second frame 62 and hermetically seals the piezoelectric element 20, the mounting plate 30, and the electronic element 40.

The configuration of the piezoelectric device 11 according to Embodiment 1 will now be described in further detail.

The piezoelectric element 20, which is substantially quadrilateral in plan view, is a crystal vibrator element including a quartz crystal blank 27 and electrodes 23 and 24. The quartz crystal blank 27 includes an upper surface 21 and a lower surface 22 opposite to the upper surface 21. The electrodes 23 and 24 extend from the upper surface 21 to the lower surface 22 of the quartz crystal blank 27. The quartz crystal blank 27 is, for example, an AT-cut quartz crystal plate. The electrodes 23 and 24 are isolated from each other. Each of the electrodes 23 and 24 divides into, for example, an excitation electrode, an extraction electrode, and a pad electrode, and extends from the upper surface 21 to the lower surface 22 over a side. The piezoelectric element 20 with such a configuration is a thickness shear mode vibrator element. Instead of such a vibrator element, a tuning-fork flexural vibrator element or a face shear mode vibrator element may be used. Instead of the crystal vibrator element, a piezoelectric element including ceramics etc. may be used. The shape in a plan view of the piezoelectric element 20 is not limited to a quadrilateral, but may be any other shape, such as a circle, an ellipse, or a polygon.

The mounting plate 30, which is substantially quadrilateral in a plan view, includes a first main surface 31 and a second main surface 32 opposite to the first main surface 31. The mounting plate 30 includes a multilayered ceramic plate made by firing a stack of multiple green sheets. As illustrated in FIG. 2, piezoelectric-element pads 33 and 34 are located on the first main surface 31, and mounting-plate electrodes 35, 36, 37, and 38 are located on the second main surface 32. The piezoelectric-element pads 33 and 34 are arranged so as to face the electrodes 23 and 24 of the piezoelectric element 20, and are electrically connected to the electrodes 23 and 24 by piezoelectric-element joining members 25 and 26, respectively. The piezoelectric-element joining members 25 and 26 are, for example, a conductive adhesive, such as epoxy resin containing silver, and have fluidity before cured. As illustrated in FIG. 2, the mounting-plate electrodes 35, 36, 37, and 38 are located at four respective corners of the second main surface 32. The piezoelectric-element pads 33 and 34 on the first main surface 31 are respectively electrically connected to the mounting-plate electrodes 35 and 36 on the second main surface 32 by interconnection (not illustrated). The interconnection includes a conductive pattern printed on the green sheets or via-hole conductors. The mounting-plate electrodes 37 and 38 are not electrically connected to anywhere, and are simply mechanically connected to the base 50. The piezoelectric-element pads 33 and 34 and the mounting-plate electrodes 35, 36, 37, and 38 each include a gold (Au) layer, serving as a surface layer, and a nickel (Ni) layer underlying the Au layer. For the mounting plate 30, for example, a quartz crystal plate may be used instead of the ceramic plate. The shape in a plan view of the mounting plate 30 is not limited to a quadrilateral, but may be any other shape, such as a circle, an ellipse, a triangle, a pentagon, or a polygon including more than five corners.

The electronic element 40 is an IC functioning as the temperature sensor 41 and functioning as, for example, an oscillation circuit for the piezoelectric element 20, and also a flip chip (FC) with bumps, serving as connection terminals 42. The bumps are made of, for example, gold or solder, and are electrically connected to electronic-element pads 53. The connection terminals 42 are equal in number to the electronic-element pads 53. In other words, a circuit formation surface, which includes the connection terminals 42, of the electronic element 40 is directed to the electronic-element pads 53 on the first bottom surface 51, or faced down, and the electronic element 40 is mounted on the base 50 with the connection terminals 42 therebetween. The temperature sensor 41 uses, for example, a forward voltage across a pn junction in the IC. Such a forward voltage across the pn junction decreases with increasing temperature. Measuring a forward voltage across the pn junction at a constant current through the pn junction yields voltage information. Conversion of the voltage information yields temperature information on the electronic element 40, or temperature information on the piezoelectric element 20. The electronic element 40 may consist of a temperature sensor, or may be a thermistor or a diode, for example. For the connection terminals 42, wires made of, for example, aluminum or gold, may be used instead of the bumps.

The substrate 60, the first frame 61, and the second frame 62, which constitute the base 50, each include a multilayered ceramic plate made by firing a stack of multiple green sheets. The first frame 61 is provided in a continuous manner on an outer peripheral edge of the substrate 60. The second frame 62 is provided in a continuous manner on an outer peripheral edge of the first frame 61. Interconnection (not illustrated) includes a conductive pattern printed on the green sheets or via-hole conductors. The electronic-element pads 53 are arranged on the first bottom surface 51 in a recessed space 63, and mounting-plate pads 55, 56, 57, and 58 are arranged on the second bottom surface 52. The electronic-element pads 53 and the mounting-plate pads 55, 56, 57, and 58 each include a gold (Au) layer, serving as a surface layer, and a nickel (Ni) layer underlying the Au layer.

The mounting-plate pads 55, 56, 57, and 58 are arranged so as to face the mounting-plate electrodes 35, 36, 37, and 38 (FIG. 2) of the mounting plate 30, and are electrically connected to the mounting-plate electrodes 35, 36, 37, and 38 by mounting-plate joining members 65, 66, 67, and 68, respectively. The mounting-plate joining members 65, 66, 67, and 68 are, for example, a conductive adhesive, such as epoxy resin containing silver, and have fluidity before cured. External terminals 54 for surface mounting are arranged on angled portions at four corners of the substrate 60. Examples of the external terminals 54 include a frequency control terminal, a ground terminal, an output terminal, and a power supply voltage terminal. The mounting-plate pads 55 and 56, the electronic-element pads 53, and the external terminals 54 are electrically connected to each other by interconnection (not illustrated). The mounting-plate pads 57 and 58 are not electrically connected to anywhere. For the mounting-plate joining members 65, 66, 67, and 68, for example, solder may be used instead of the conductive adhesive.

The lid 70 is made of, for example, ceramic or metal, such as Kovar, and is a rectangular flat plate. The lid 70 is joined to the base 50 by, for example, electric welding or glass sealing, thus hermetically sealing the recessed space 63.

The recessed space 63 is a space surrounded by the substrate 60, the first frame 61, the second frame 62, and the lid 70. In other words, the recessed space 63 is defined in the base 50 and contains the piezoelectric element 20, the mounting plate 30, and the electronic element 40.

The piezoelectric device 11 is configured such that the piezoelectric element 20, the mounting plate 30, and the electronic element 40 are hermetically enclosed in the recessed space 63 by joining the lid 70 to the base 50, on which the piezoelectric element 20, the mounting plate 30, and the electronic element 40 are mounted, through seam welding or glass sealing. As described above, the piezoelectric device 11 is a surface-mount crystal oscillator including the piezoelectric element 20. The crystal oscillator, which serves as a reference clock signal source of an apparatus, is required to have higher reliability than other electronic components.

A method for assembling the piezoelectric device 11 will now be described.

Figure 13:
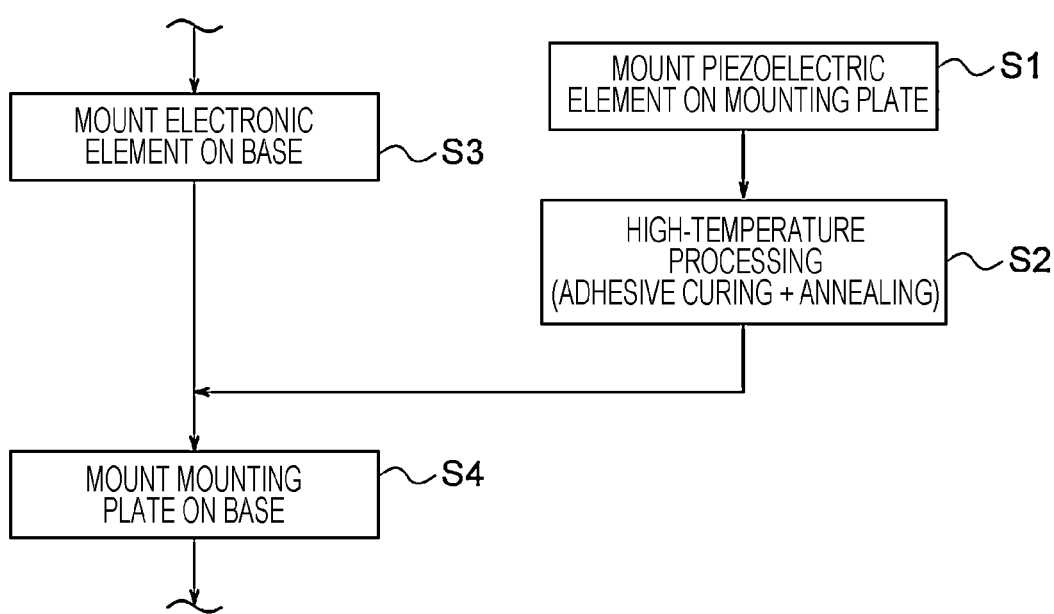
FIG. 13 is a flowchart illustrating a method for making the piezoelectric device according to each of Embodiments 1 to 3.

(First Step: S1, S2 in FIG. 13) As illustrated in FIG. 2, the piezoelectric-element joining members 25 and 26, which are made of a conductive adhesive, are applied to the piezoelectric-element pads 33 and 34 on the first main surface 31 of the mounting plate 30. The electrodes 23 and 24 of the piezoelectric element 20 are respectively placed on the piezoelectric-element joining members 25 and 26, and are subjected to heat treatment for 10 to 30 minutes at a high temperature of, for example, from 300° C. to 350° C., thereby curing the piezoelectric-element joining members 25 and 26. At this time, the piezoelectric element 20 is fixed as a cantilever. The piezoelectric-element joining members 25 and 26 are immediately cured at a high temperature so that the piezoelectric element 20 is unlikely to tilt, come in contact with an upper or lower member, and be fixed to the upper or lower member. The piezoelectric element 20 is mounted on the mounting plate 30 in this manner. Then, the mounting plate 30 with the piezoelectric element 20 mounted thereon is subjected to annealing for five to 15 minutes at a high temperature of, for example, from 300° C. to 350° C. in order to stabilize the properties of the piezoelectric element 20.

(Second Step: S3 in FIG. 13) Separately from the first step, the formation surface, which includes the connection terminals 42, of the electronic element 40 is directed to the first bottom surface 51 in the recessed space 63, the connection terminals 42 are aligned with the electronic-element pads 53, and the connection terminals 42 are pressed against the electronic-element pads 53 under application of heat or ultrasound. Thus, the connection terminals 42 are joined to the electronic-element pads 53.

(Third Step: S4 in FIG. 13) After the first and second steps, the mounting-plate joining members 65, 66, 67, and 68, which are the conductive adhesive, are applied to the mounting-plate pads 55, 56, 57, and 58 on the second bottom surface 52, respectively. Then, the mounting-plate electrodes 35, 36, 37, and 38 (FIG. 2) of the mounting plate 30 are placed on the mounting-plate joining members 65, 66, 67, and 68, respectively. The mounting-plate joining members 65, 66, 67, and 68 are cured at room temperature or high temperature. At this time, a lower curing temperature than that in the first step can be used because it is unnecessary to take into account a tilt and the like of the mounting plate 30.

(Fourth Step) After the third step, the recessed space 63 of the base 50 is closed by the lid 70. Thus, the piezoelectric device 11 is completed.

The advantageous effects of the piezoelectric device 11 will now be described.

Comparative Example illustrated in FIG. 5 will be described first. A piezoelectric device 10 according to Comparative Example includes no mounting plate 30, which has been described in Embodiment 1. In other words, the piezoelectric device 10 includes the same configuration as that of the piezoelectric device 11 according to Embodiment 1, except that the piezoelectric element 20 is mounted directly on the base 50 without the mounting plate 30 therebetween.

(1) The piezoelectric device 10 according to Comparative Example is configured such that the electronic element 40 is located deeper than the piezoelectric element 20 in the recessed space 63. It is therefore necessary to mount the electronic element 40 before mounting the piezoelectric element 20 (FIG. 11). Accordingly, after the electronic element 40 is mounted on the base 50 (S11 in FIG. 11), the piezoelectric element 20 is mounted on the base 50 (S12 in FIG. 11). The piezoelectric element 20 is then subjected to high-temperature processing (S13 in FIG. 11). At this time, the electronic element 40 may be affected in its electrical characteristics by the high-temperature processing, which is unnecessary for the electronic element 40, performed on the electronic element 40 in mounting the piezoelectric element 20.

In contrast, the piezoelectric device 11 according to Embodiment 1 includes the piezoelectric element 20 mounted on the base with the mounting plate 30 therebetween. Such a configuration allows only the piezoelectric element 20 and the mounting plate 30 to undergo the high-temperature processing in mounting the piezoelectric element 20 (51, S2 in FIG. 13). This reduces or eliminates the likelihood that the electronic element 40 may be affected in its electrical characteristics by the high-temperature processing, which is unnecessary for the electronic element 40, performed on the electronic element 40 in mounting the piezoelectric element 20. Thus, the issue arising from the order in which the piezoelectric element 20 and the electronic element 40 are mounted on the base 50 can be solved, leading to improved electrical characteristics of the piezoelectric device 11.

Figure 5:
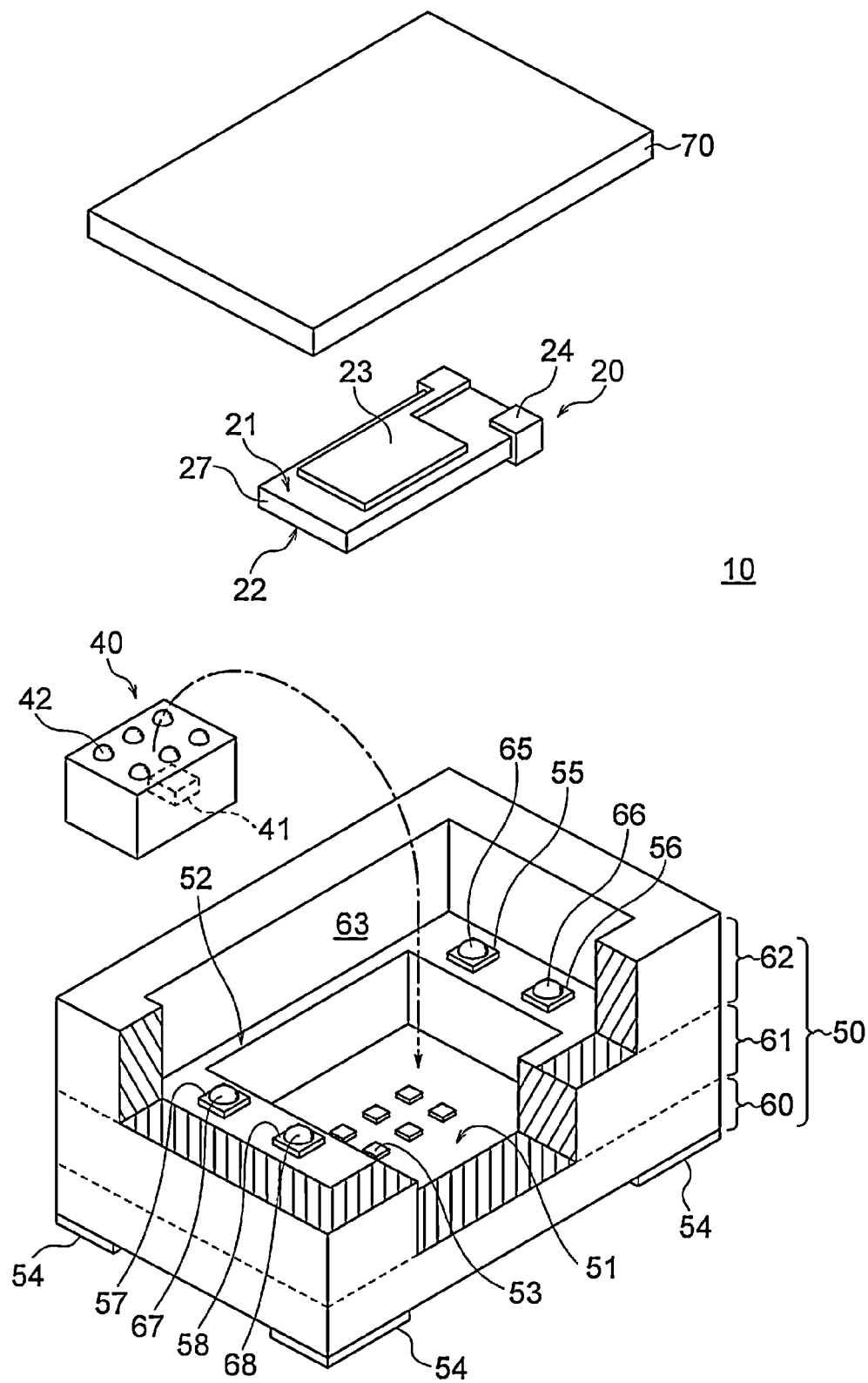
FIG. 5 is an exploded perspective view of a piezoelectric device according to Comparative Example.

(2) The following expression may hold.

$$|\tau s - \tau x1| < |\tau s - \tau x2|$$

where $\tau s$ (FIG. 6) denotes the thermal time constant of heat transferred from the base 50 to the electronic element 40, $\tau x1$ denotes the thermal time constant of heat transferred from the base 50 to the piezoelectric element 20 through the mounting plate 30, and $\tau x2$ (FIG. 6) denotes the thermal time constant of heat transferred from the base 50 mounted directly to the piezoelectric element 20 without the mounting plate 30 therebetween (refer to Comparative Example of FIG. 5).

Each of the thermal time constants may be the time that it takes for a respective one of the electronic element 40 and the piezoelectric element 20 to change from T1 to {T1+ (T2−T1)×0.632} while the ambient temperature of the piezoelectric device 11 changes from T1 to T2.

Figure 6:
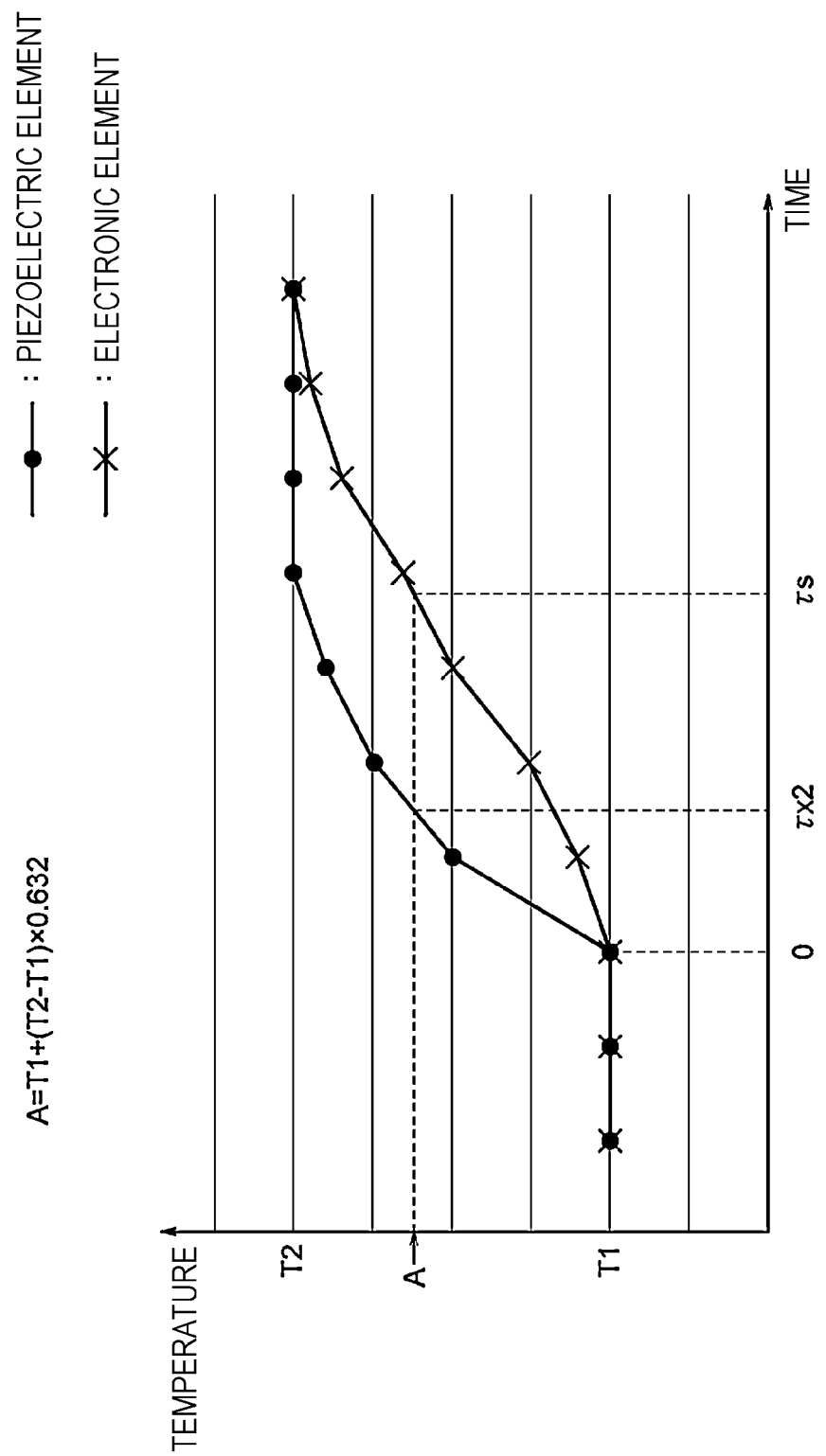
FIG. 6 is a graph showing exemplary changes in temperature of an electronic element and exemplary changes in temperature of a piezoelectric element in the piezoelectric device according to Comparative Example while the ambient temperature of the piezoelectric device changed from T1 to T2.
Figure 7:
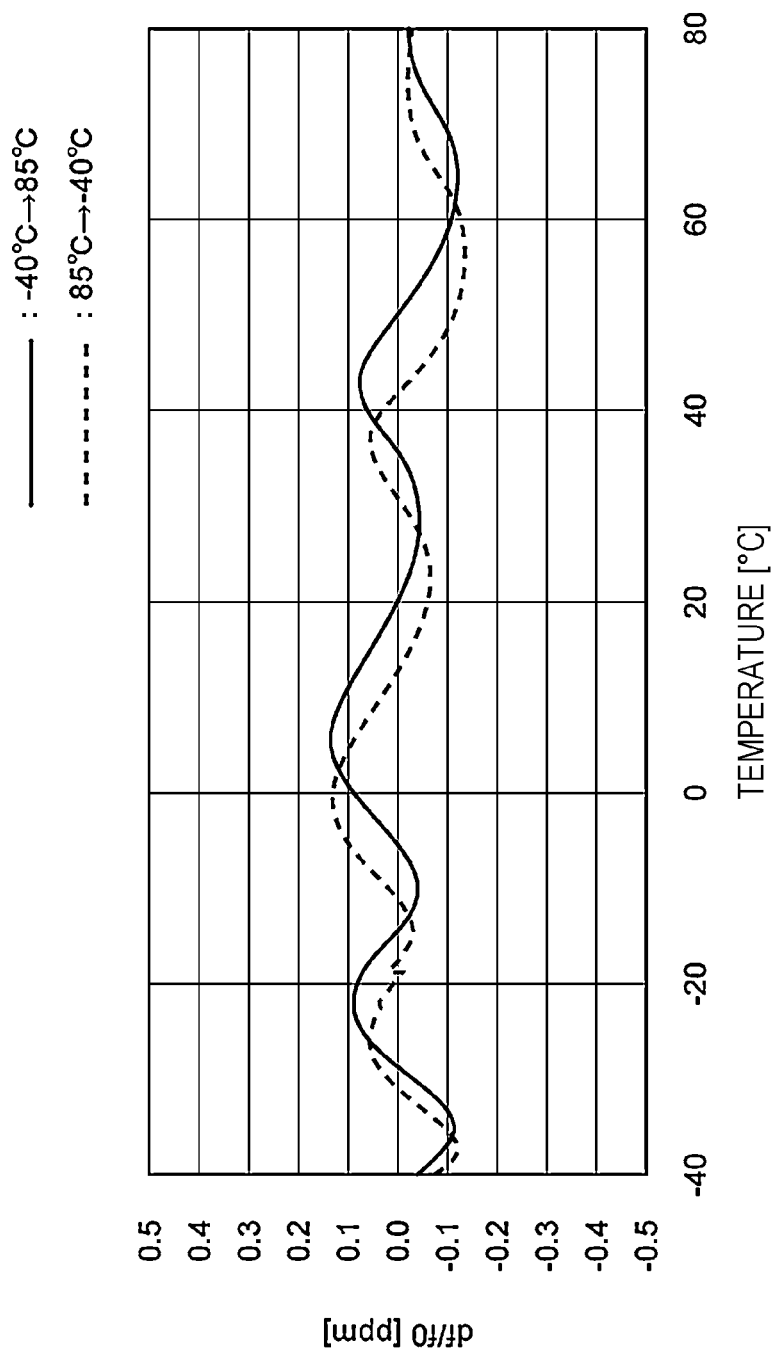
FIG. 7 is a graph showing exemplary changes in frequency while the ambient temperature of the piezoelectric device according to Comparative Example is changed.

In this case, as illustrated in FIG. 6, the thermal time constant $\tau x2$ for the piezoelectric element 20 in the piezoelectric device 10 according to Comparative Example is considerably smaller than the thermal time constant $\tau s$ for the electronic element 40. Accordingly, as illustrated in FIG. 7, a frequency change (df/f0) in increasing the ambient temperature of the piezoelectric device 10 (−40° C.→85° C.) differs from that in reducing the ambient temperature of the piezoelectric device 10 (85° C.→−40° C.).

Figure 8:
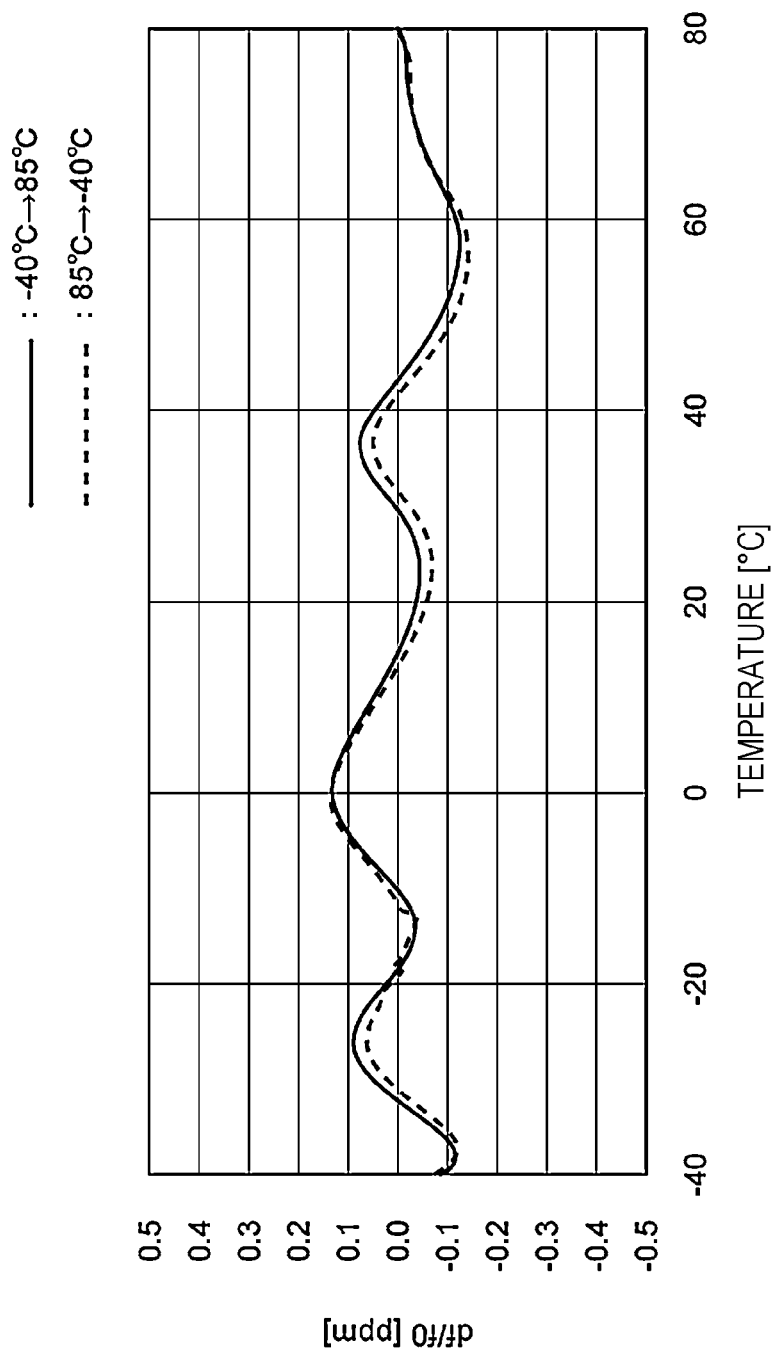
FIG. 8 is a graph showing exemplary changes in frequency while the ambient temperature of the piezoelectric device according to Embodiment 1 is changed.

In contrast, since the piezoelectric device 11 according to Embodiment 1 includes the piezoelectric element 20 mounted on the base with the mounting plate 30 therebetween, the thermal time constant $\tau x1$ for the piezoelectric element 20 can be increased and can be close to the thermal time constant $\tau s$ for the electronic element 40. Thus, as illustrated in FIG. 8, the difference between the frequency change (df/f0) in increasing the ambient temperature of the piezoelectric device 11 (−40° C.→85° C.) and that in reducing the ambient temperature of the piezoelectric device 11 (85° C.→−40° C.) is smaller than that in FIG. 7.

As described above, the piezoelectric device 11 according to Embodiment 1 includes the piezoelectric element 20 mounted on the base with the mounting plate 30 therebetween. Such a configuration allows transfer of the ambient temperature of the piezoelectric device 11 to the piezoelectric element 20 to be delayed by an amount corresponding to the mounting plate 30. This can reduce the difference in temperature between the piezoelectric element 20 and the electronic element 40 if the temperature of the piezoelectric element 20 changes earlier than the temperature of the electronic element 40. Thus, the issue arising from the temperature difference between the piezoelectric element 20 and the electronic element 40 can be solved, leading to improved frequency stability of the piezoelectric device 11.

Examples of methods for obtaining an actual temperature of the piezoelectric element 20 include measurement with a thermocouple, measurement with a very small hole formed in the base 50 or the lid 70 and a radiation thermometer, and calculation based on computer simulation.

(3) The piezoelectric element 20, the electronic element 40, and the mounting plate 30 interposed therebetween may be superposed on each other in a plan view. Such a configuration allows the piezoelectric device 11 to occupy less area, resulting in a reduction in size of the piezoelectric device 11. In addition, the electrodes 23 and 24 of the piezoelectric element 20 sealing the electronic element 40 can reduce noise to be added to a signal of the electronic element 40.

(4) In a plan view, the mounting plate 30 may be equal in size to the piezoelectric element 20 or may be greater in size to the piezoelectric element 20 to encompass the piezoelectric element 20. Such a configuration allows the mounting plate 30 to have a larger heat capacity and further allows the mounting plate 30 to function as a shield against heat radiated from the base 50. Thus, the thermal time constant $\tau x1$ for the piezoelectric element 20 can be increased.

(5) The mounting plate 30 may be made of the same material (e.g., ceramic) as that of the base 50. Such a configuration causes the mounting plate 30 and the base 50 to have the same coefficient of thermal expansion. This can reduce distortion of the mounting plate 30 and the base 50 that is caused by a change in temperature.

Embodiment 2

Figure 9:
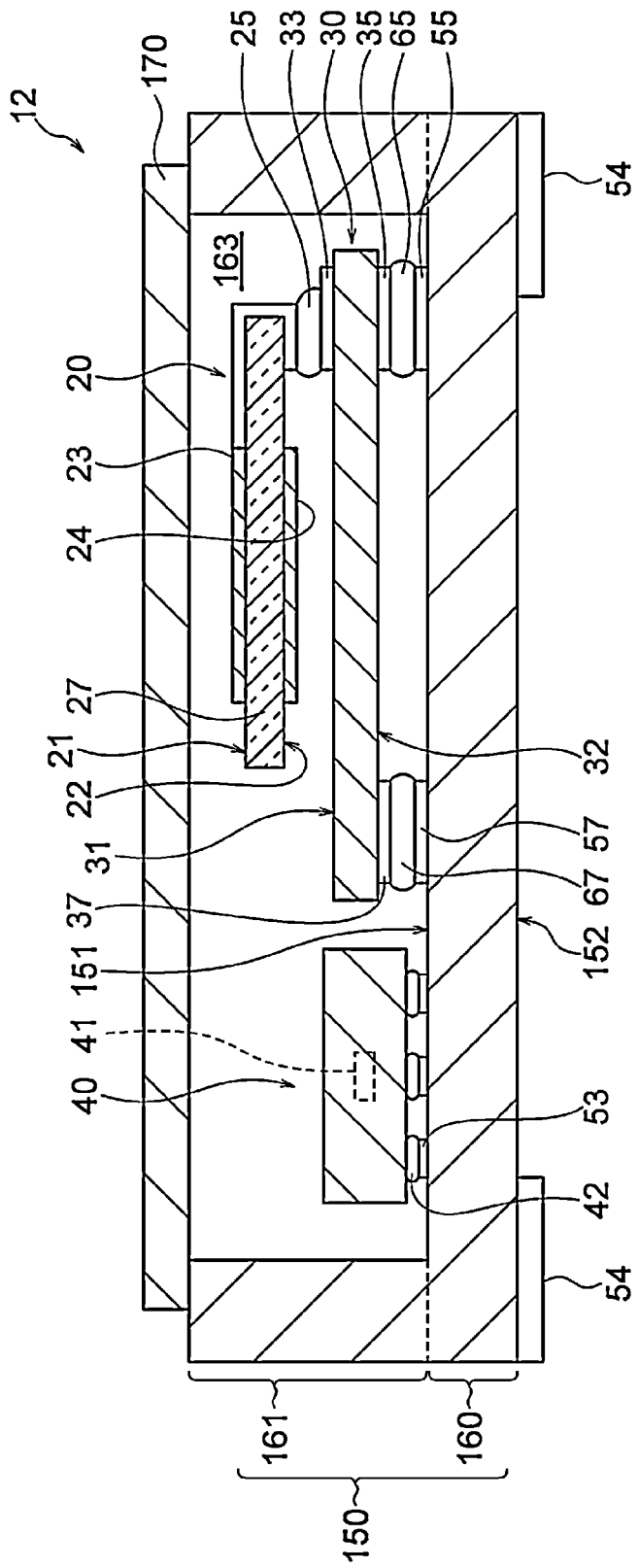
FIG. 9 is a sectional view of a piezoelectric device according to Embodiment 2.

As illustrated in FIG. 9, the structure of a base 150 of a piezoelectric device 12 according to Embodiment 2 differs from that in Embodiment 1. The base 150 includes a substrate 160 and a frame 161. The substrate 160 includes an inner surface 151 and an outer surface 152 opposite to the inner surface 151. The piezoelectric element 20 is mounted on the inner surface 151 with the mounting plate 30 therebetween. The electronic element 40 is mounted on the inner surface 151. The frame 161 is located on an outer peripheral edge of the inner surface 151. A lid 170 is joined to the frame 161 and hermetically seals the piezoelectric element 20, the mounting plate 30, and the electronic element 40.

The substrate 160, the frame 161, and the lid 170 define a space, which is a recessed space 163. In Embodiment 2, the base 150 is recessed, and the lid 170 is flat. Conversely, the base 150 may be flat, and the lid 170 may be recessed.

In the piezoelectric device 12 according to Embodiment 2, the piezoelectric element 20 and the electronic element 40 are located on the inner surface 151, or the same plane, in the recessed space 163. Unlike the configuration in Embodiment 1, such a configuration enables the piezoelectric element 20 to be mounted before the electronic element 40 is mounted (FIG. 12) and also enables the electronic element 40 to be mounted before the piezoelectric element 20 is mounted (FIG. 11). If the mounting plate 30 with the piezoelectric element 20 is mounted (S4 in FIG. 13) after the electronic element 40 is mounted (S3 in FIG. 13), the electronic element 40 will not undergo the high-temperature processing, which is unnecessary for the electronic element. Accordingly, after the electronic element 40 is mounted (S3 in FIG. 13), the mounting plate 30 with the piezoelectric element 20 is mounted (S4 in FIG. 13). This eliminates the likelihood of, for example, deposition of dust on the piezoelectric element 20 in mounting the electronic element 40 (S3 in FIG. 13).

Furthermore, this configuration, in which the piezoelectric element 20 and the electronic element 40 undergo heat conduction through the same substrate 160, enables the thermal time constant for the piezoelectric element 20 to be closer to that for the electronic element 40. The rest of the configuration and the advantageous effects in Embodiment 2 are the same as and/or similar to those in Embodiment 1.

Embodiment 3

Figure 10:
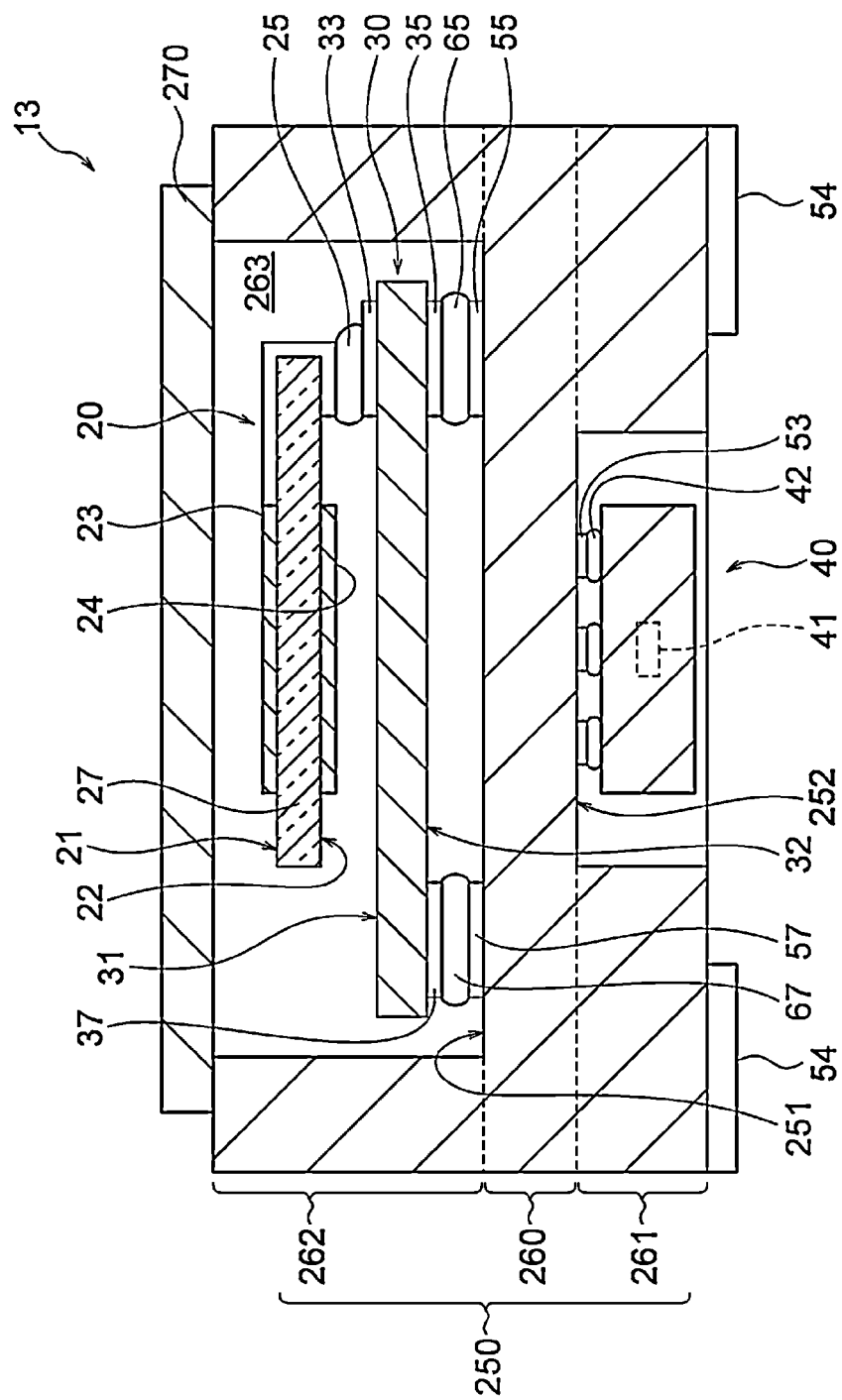
FIG. 10 is a sectional view of a piezoelectric device according to Embodiment 3.

As illustrated in FIG. 10, the structure of a base 250 of a piezoelectric device 13 according to Embodiment 3 differs from that in Embodiment 1. The base 250 includes a substrate 260, a first frame 261, and a second frame 262. The substrate 260 includes an inner surface 251 and an outer surface 252 opposite to the inner surface 251. The piezoelectric element 20 is mounted on the inner surface 251 with the mounting plate 30 therebetween. The electronic element 40 is mounted on the outer surface 252. The first frame 261 is located on an outer peripheral edge of the outer surface 252. The second frame 262 is located on an outer peripheral edge of the inner surface 251. A lid 270 is joined to the second frame 262 and hermetically seals the piezoelectric element 20 and the mounting plate 30.

The substrate 260, the second frame 262, and the lid 270 define a space, which is a recessed space 263. Although the second frame 262 is located in the base 250 in Embodiment 3, the second frame 262 may be located in the lid 270. In other words, the lid 270, which is flat, may be recessed.

In the piezoelectric device 13 according to Embodiment 3, the piezoelectric element 20 is located on the inner surface 251 of the substrate 260, and the electronic element 40 is located on the outer surface 252. Unlike the configuration in Embodiment 1, such a configuration enables the piezoelectric element 20 to be mounted before the electronic element 40 is mounted (FIG. 12) and also enables the electronic element 40 to be mounted before the piezoelectric element 20 is mounted (FIG. 11). If the mounting plate 30 with the piezoelectric element 20 is mounted (S4 in FIG. 13) after the electronic element 40 is mounted (S3 in FIG. 13), the electronic element 40 will not undergo the high-temperature processing, which is unnecessary for the electronic element. Accordingly, after the electronic element 40 is mounted (S3 in FIG. 13), the mounting plate 30 with the piezoelectric element 20 is mounted (S4 in FIG. 13). This eliminates the likelihood of, for example, deposition of dust on the piezoelectric element 20 in mounting the electronic element 40 (S3 in FIG. 13). The rest of the configuration and the advantageous effects in Embodiment 3 are the same as and/or similar to those in Embodiment 1.

<Other Supplements>

The piezoelectric device with such a configuration is mounted on the surface of a printed circuit board included in an electronic device by fixing bottom surfaces of the external terminals to the printed circuit board through, for example, soldering, Au bumps, or a conductive adhesive. The piezoelectric device can be used as an oscillating source in various electronic devices including a personal computer, a clock, a game machine, a communications device, and an in-vehicle device, such as a car navigation system. In this piezoelectric device, the difference between a temperature obtained by conversion of a voltage outputted from the temperature sensor and an actual ambient temperature of the piezoelectric device can be reduced. Thus, the piezoelectric device can be readily corrected by an IC of an electronic device and thus output a stable oscillation frequency. This enables an electronic device including the piezoelectric device according to any of the above-described embodiments to operate reliably and precisely.

Although the present disclosure has been described with reference to the above-described embodiments, the embodiments are not intended to be construed as limiting the present disclosure. Various changes that can be understood by those skilled in the art can be made to the configurations and details of the present disclosure. An appropriate combination of some or all of the features of the above-described embodiments is intended to be embraced within the scope of the present disclosure.

This application claims the benefit of priority from Japanese Patent Application No. 2020-128278, filed Jul. 29, 2020, which is hereby incorporated by reference herein in its entirety.

The invention claimed is:

1. A piezoelectric device comprising:
   a piezoelectric element;
   a mounting plate;
   an electronic element comprising a temperature sensor therein;
   a base on which the piezoelectric element is mounted with the mounting plate therebetween, and on which the electronic element is mounted, wherein the base comprises:
      a substrate comprising a first bottom surface on which the electronic element is mounted;
      a first frame located on an outer peripheral edge of the first bottom surface and comprising a second bottom surface on which the piezoelectric element is mounted with the mounting plate therebetween; and
      a second frame located on an outer peripheral edge of the second bottom surface; and
   a lid joined to the base and hermetically sealing at least the piezoelectric element and the mounting plate, wherein the lid is joined to the second frame and hermetically seals the piezoelectric element, the mounting plate, and the electronic element.

2. The piezoelectric device according to claim 1, wherein the piezoelectric element, the electronic element, and the mounting plate interposed therebetween are superposed on each other in a plan view.

3. The piezoelectric device according to claim 1, wherein, in a plan view, the mounting plate is equal in size to the piezoelectric element or is greater in size to the piezoelectric element to encompass the piezoelectric element.

4. The piezoelectric device according to claim 1, wherein the mounting plate and the base are made of a same material.

5. The piezoelectric device according to claim 1, wherein the piezoelectric device satisfies $|\tau s-\tau x1|<|\tau s-\tau x2|$
   where
   $\tau s$ denotes a thermal time constant of heat transferred from the base to the electronic element,
   $\tau x1$ denotes a thermal time constant of heat transferred from the base to the piezoelectric element through the mounting plate, and
   $\tau x2$ denotes a thermal time constant of heat transferred from the base mounted directly to the piezoelectric element without the mounting plate therebetween.

6. The piezoelectric device according to claim 5, wherein each thermal time constant is a time that it takes for a respective one of the electronic element and the piezoelectric element to change from T1 to $\{T1+(T2-T1)\times 0.632\}$ while an ambient temperature of the piezoelectric device changes from T1 to T2.

7. A piezoelectric device comprising:
   a piezoelectric element;

a mounting plate;

an electronic element comprising a temperature sensor therein;

a base on which the piezoelectric element is mounted with the mounting plate therebetween, and on which the electronic element is mounted, wherein the base comprises:

a substrate comprising an inner surface and an outer surface opposite to the inner surface, the piezoelectric element being mounted on the inner surface with the mounting plate therebetween, the electronic element being mounted on the inner surface; and a frame located on an outer peripheral edge of the inner surface; and a lid joined to the base and hermetically sealing at least the piezoelectric element and the mounting plate, wherein the lid is joined to the frame and hermetically seals the piezoelectric element, the mounting plate, and the electronic element.

8. The piezoelectric device according to claim 7, wherein, in a plan view, the mounting plate is equal in size to the piezoelectric element or is greater in size to the piezoelectric element to encompass the piezoelectric element.

9. The piezoelectric device according to claim 7, wherein the mounting plate and the base are made of a same material.

10. The piezoelectric device according to claim 7, wherein the piezoelectric device satisfies $|\tau s-\tau x1|<|\tau s-\tau x2|$ where $\tau s$ denotes a thermal time constant of heat transferred from the base to the electronic element, $\tau x1$ denotes a thermal time constant of heat transferred from the base to the piezoelectric element through the mounting plate, and $\tau x2$ denotes a thermal time constant of heat transferred from the base mounted directly to the piezoelectric element without the mounting plate therebetween.

11. The piezoelectric device according to claim 10, wherein each thermal time constant is a time that it takes for a respective one of the electronic element and the piezoelectric element to change from T1 to $\{T1+(T2-T1)\times0.632\}$ while an ambient temperature of the piezoelectric device changes from T1 to T2.

12. A piezoelectric device comprising:

piezoelectric element;

a mounting plate;

an electronic element comprising a temperature sensor therein;

a base on which the piezoelectric element is mounted with the mounting plate therebetween, and on which the electronic element is mounted, wherein the base comprises:

a substrate comprising an inner surface and an outer surface opposite to the inner surface, the piezoelectric element being mounted on the inner surface with the mounting plate therebetween, the electronic element being mounted on the outer surface;

a first frame located on an outer peripheral edge of the outer surface; and a second frame located on an outer peripheral edge of the inner surface; and a lid joined to the base and hermetically sealing at least the piezoelectric element and the mounting plate, wherein the lid is joined to the second frame and hermetically seals the piezoelectric element and the mounting plate.

13. The piezoelectric device according to claim 12, wherein the piezoelectric element, the electronic element, and the mounting plate interposed therebetween are superposed on each other in a plan view.

14. The piezoelectric device according to claim 12, wherein, in a plan view, the mounting plate is equal in size to the piezoelectric element or is greater in size to the piezoelectric element to encompass the piezoelectric element.

15. The piezoelectric device according to claim 12, wherein the mounting plate and the base are made of a same material.

16. The piezoelectric device according to claim 12, wherein the piezoelectric device satisfies $|\tau s-\tau x1|<|\tau s-\tau x2|$ where $\tau s$ denotes a thermal time constant of heat transferred from the base to the electronic element, $\tau x1$ denotes a thermal time constant of heat transferred from the base to the piezoelectric element through the mounting plate, and $\tau x2$ denotes a thermal time constant of heat transferred from the base mounted directly to the piezoelectric element without the mounting plate therebetween.

17. The piezoelectric device according to claim 16, wherein each thermal time constant is a time that it takes for a respective one of the electronic element and the piezoelectric element to change from T1 to $\{T1+(T2-T1)\times0.632\}$ while an ambient temperature of the piezoelectric device changes from T1 to T2.

* * * * *